United States Patent [19]

Culp

[11] Patent Number: 4,577,163

[45] Date of Patent: Mar. 18, 1986

[54] DIGITAL PHASE LOCKED LOOP

[75] Inventor: Norman L. Culp, Colorado Springs, Colo.

[73] Assignee: Honeywell Inc., Phoenix, Ariz.

[21] Appl. No.: 629,035

[22] Filed: Jul. 9, 1984

[51] Int. Cl.[4] ............................................. H03L 7/18
[52] U.S. Cl. ................................... 331/1 A; 328/14; 328/155; 331/17; 331/25
[58] Field of Search .......................... 331/1 A, 17, 25; 328/155, 14

[56] References Cited

U.S. PATENT DOCUMENTS 4,144,489  3/1979  Ward et al. .................... 331/1 A X
4,380,742  4/1983  Hart ................................... 331/1 A

OTHER PUBLICATIONS

Szymonski, "An Improved DCO Scheme for Digital Phase Locked Loops", Electronic Engineering, Mar. 1977, pp. 24, 25, (328–155).

Primary Examiner—Siegfried H. Grimm
Attorney, Agent, or Firm—A. A. Sapelli; J. S. Solakian; A. Medved

[57] ABSTRACT

A digital phase locked loop is provided by the present invention which includes a digital controlled oscillator (DCO), whereby the frequency of the output signal of the DCO is a function of the value associated with a digital input word. The frequency of the output signal of the DCO is phase compared to a reference signal by a phase comparator. Depending upon which signal is leading or lagging, the phase comparator outputs an increment signal or a decrement signal. These increment and decrement signals are operatively coupled to an up/down counter which provides the digital input word to the DCO, the value of the digital input word being modified by the increment or decrement signal to cause the frequency of the output signal to track the frequency of the input signal to the phase comparator, i.e., the frequency of the reference signal.

2 Claims, 3 Drawing Figures

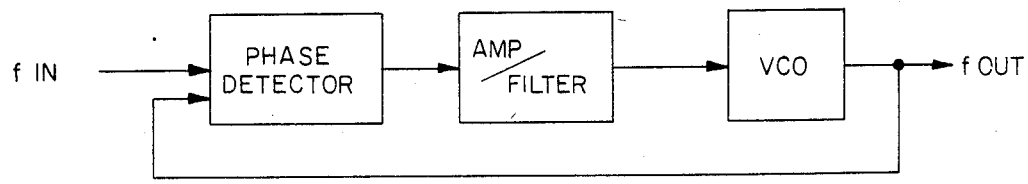
FIG. IA
PRIOR ART
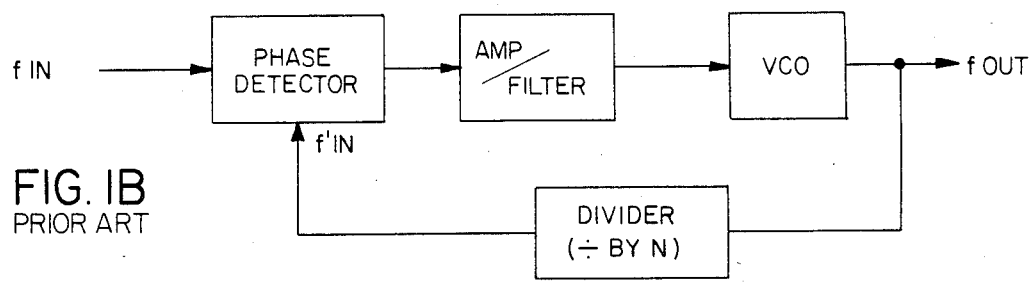
FIG. IB
PRIOR ART
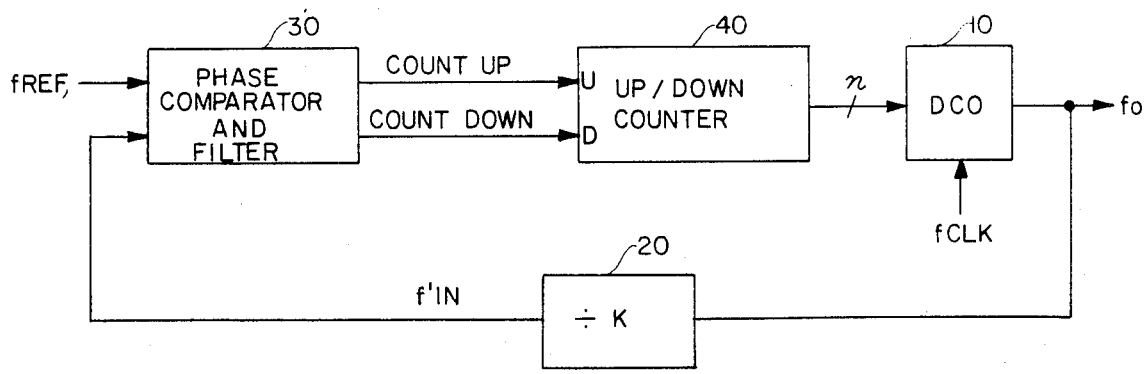
FIG. 2

DIGITAL PHASE LOCKED LOOP

BACKGROUND OF THE INVENTION

This invention relates to phase correction and control systems, and more particularly, to a frequency stabilizing circuit which includes a synchronized or locked oscillator, wherein a first frequency reference signal is compared with a variable frequency signal, the frequency stabilizing circuit generally known as a phase locked loop.

A phase locked loop is a device for producing an output signal which can track an input signal in frequency and exhibit a fixed phase relationship to the input signal. As the input signal changes in frequency, the output signal will likewise change in frequency in such a manner as to maintain the phase relationship between the input and output signals.

In the past, phase locked loops have been implemented using analog techniques. A basic analog phase locked loop consists of three fundamental parts: A phase detector, an amplifier/filter (or more simply, a filter) and a voltage controlled oscillator (VCO).

The phase detector is a device which detects the difference in phase between two input signals, and produces an output signal proportional to the amount of the phase difference. In a phase locked loop, the two inputs to the phase detector are the input signal to the phase locked loop, and the output signal of the voltage controlled oscillator, i.e., of the phase locked loop. The output signal from the phase detector is an analog signal, the magnitude which is representative of the amount of phase difference between the two input signals thereto, hereinafter referred to as an error signal.

The filter serves to remove any high-frequency components from the error signal produced by the phase detector, and provides a slowly varying output signal which is representative of the average error in phase between the output signal and the input signal.

The voltage controlled oscillator is an oscillator which generates an output signal having a frequency controlled by the slowly varying output signal of the filter. In a phase locked loop, the input signal to the voltage controlled oscillator is the output of the filter, and is an error signal representative of the difference in phase between the input signal and the output signal. Due to the feedback of the output signal to one input of the phase detector, the frequency of the voltage controlled oscillator is adjusted by the VCO input signal to maintain the fixed relationship between the input signal and the output signal.

While present day implementations of phase locked loops have employed varying amounts of digital techniques, analog techniques have always been present, to some extent, and most notably in the VCO section of the phase locked loop.

The present invention provides an implementation of the phase locked loop by using digital techniques entirely, including a digital VCO; namely, the frequency of the output signal of the digital VCO is related to the value of an n-bit digital input word (i.e., is a function of the value associated with the digital input word).

SUMMARY OF THE INVENTION

Therefore, there is provided by the present invention, a digital phase locked loop which comprises a digital controlled oscillator element for generating an output signal having a frequency which is a function of a value associated with a digital input word. A counter element, operatively connected to the digital controlled oscillator element, having an up input terminal adapted to receive an up input signal, and having a down input terminal adapted to receive a down input signal, modifies a binary number contained in the counter element in response to the up input signal and in response to the down input signal, the binary number being operatively coupled to the digital controlled oscillator element. A phase comparator element, operatively connected to the counter element, compares the frequency of a reference signal to the frequency of the output signal, to generate the up input signal when the output signal lags the reference signal, and to generate the down input signal when the output signal leads the reference signal.

Accordingly, it is an object of the present invention to provide a digital phase locked loop.

It is another object of the present invention to provide a phase locked loop entirely implemented utilizing digital techniques.

It is still another object of the present invention to provide a phase locked loop entirely implemented utilizing digital techniques, including a digital voltage controlled oscillator.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 1A and FIG. 1B show a functional block diagram of analog phase locked loop circuits of the prior art;

FIG. 2 shows a functional block diagram of a digital phase locked loop of the present invention.

DETAILED DESCRIPTION

Figure 3:
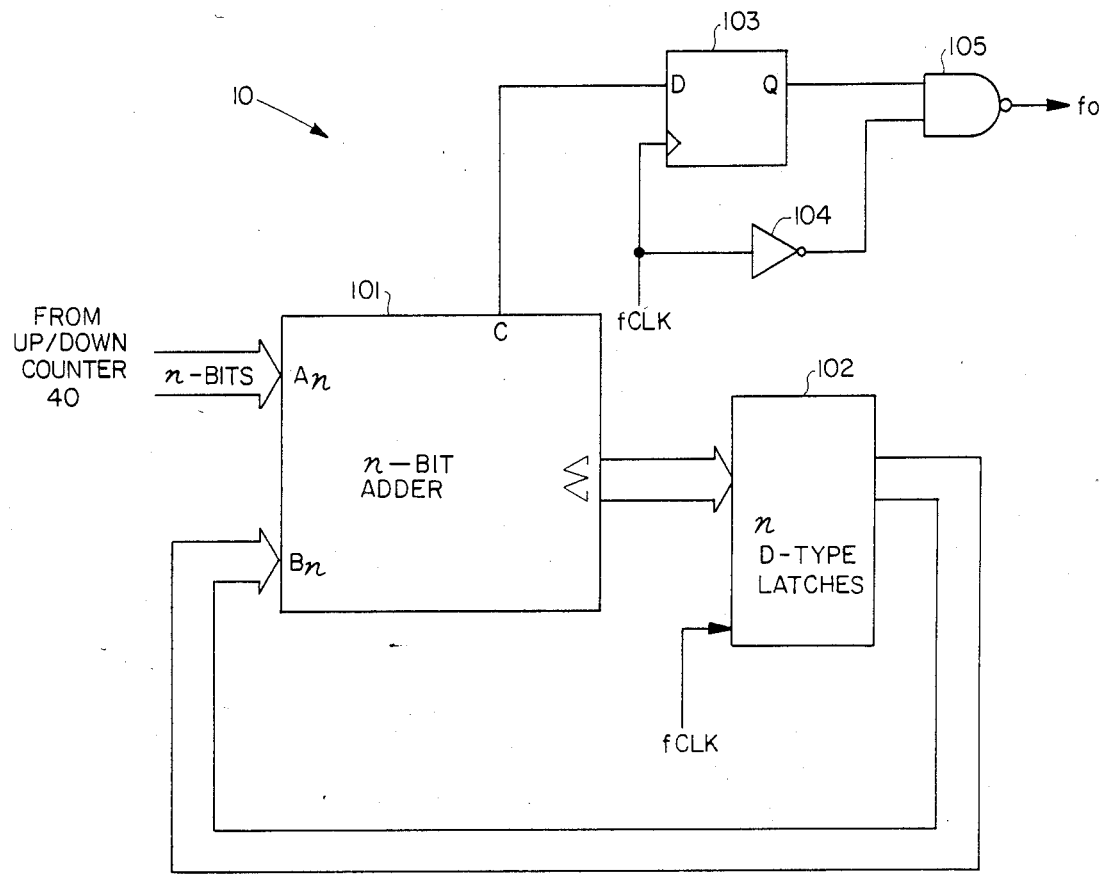
FIG. 3 shows a block diagram of a digital controlled oscillator utilized in the digital phase locked loop of the present invention.

Referring to FIGS. 1A and 1B, there is shown two functional block diagrams of an analog phase locked loop (PLL) of the prior art. FIG. 1A shows the basic PLL, and FIG. 1B shows a PLL in which the frequency of the output signal ($f_{out}$) is too high for direct application to the phase detector thus requiring the use of a divider. In frequency synthesis applications, the divider can be of the "programmable-divider" type thereby permitting frequency selection by varying the divider ratio N. In FIG. 1A, $f_{in} = f_{out}$, and in FIG. 1B, $f_{out} = N \cdot f_{in}$.

Referring to FIG. 2, there is shown a functional block diagram of a digital phase locked loop (PLL) of the present invention, which includes the digital controlled oscillator (DCO) 10. The DCO 10 outputs a signal having a frequency $f_\phi$, which is also the output signal of the digital PLL. (Note, that the signals are denoted herein by their frequency.) DCO 10, which will be described in further detail hereinunder, outputs a signal frequency $f_\phi$ which is related to (i.e., is a function of) the value of the binary word input of n bits (equation 1).

$$f_\phi = f(\text{value of binary input word}) \qquad (1)$$

The frequency of the output signal $f_\phi$ is divided by a divide circuit ($\div K$) 20 to provide a signal $f_{in}'$ having the proper scaling. An input signal having a frequency $f_{ref}$, which is the signal to be tracked by output signal $f_\phi$, is compared to $f_{in}'$ by phase comparator and filter 30 (or more simply referred to herein as phase comparator 30). If $f_{in}'$ is lagging $f_{ref}$ in phase, the phase comparator 30 transmits a COUNT UP signal to increment an up/down counter 40, which ultimately increases the frequency of the output signal $f_{in}'$ of the divide circuit 20. If $f_{in}'$ is leading $f_{ref}$, the phase comparator 30 transmits a COUNT DOWN signal to decrement the up/down counter 40, which ultimately decreases the frequency of the output signal $f_{in}'$ of the divide circuit 20. The output of $f_{in}'$ of the divide circuit 20 is given by equation 2.

$$f_{in}' = (N \times f_{clk})/(K \times 2^n) \qquad (2)$$

where N is the value contained in the up/down counter 40 and n is the number of bits of up/down counter 40. In the digital PLL of the present invention, the control loop adjusts the value of N to compensate for variations in $f_{clk}$.

The digital PLL operates by comparing the phase of the frequency, $f_{in}'$, with the reference frequency, $f_{ref}$. If $f_{ref}$ is higher in frequency or leads $f_{in}'$ in phase, the phase comparator 30 causes the up/down counter 40 to count up which increases N, the digital number contained in up/down counter 40, to the DCO 10, resulting in $f_{in}'$ increasing in frequency. For the case where $f_{in}'$ is higher in frequency or leads $f_{ref}$ in phase, the phase comparator 30 causes the up/down counter 40 to count down, which results in $f_{in}'$ decreasing in frequency. The accuracy of the master clock ($f_{clk}$) is not critical since the control loop will adjust N as required to maintain lock.

Referring to FIG. 3, there is shown a block diagram of the DCO 10. The DCO 10 comprises an n-bit adder 101 (or more simply referred to herein as adder 101), and D-type latches 102 (or more simply referred to herein as latches 102), and a carry latch 103. The output of latches 102 is coupled to the B inputs of adder 101. The adder 101 receives the n-bit word, N, from up/down counter 40 at the A inputs. The latches 102 are clocked by $f_{clk}$ and for every cycle of $f_{clk}$, N is added to the previous sum of adder 101 which was stored in latches 102. The resultant sum is then coupled to the output of adder 101 for storing in the latches 102 and added to N on the next $f_{clk}$ cycle. Thus, for every cycle of $f_{clk}$, N is added to the previous sum of the adder 101. The carry output, C, from the adder 101 is strobed into the carry latch 103 on each cycle of $f_{clk}$. The carry latch output is the clock for the divide circuit 20 and is required to insure a clock pulse is generated every $f_{clk}$ cycle for the case where a carry is generated for two or more sequential add cycles. Inverter 104 and NAND gate 105 insure that a pulse is generated at $f_\phi$ for each $f_{clk}$ for the condition where C remains high for successive addition cycles. The frequency of output signal $f_\phi$ is given by equation 3.

$$f_\phi = N \times f_{clk}/2^n, \qquad (3)$$

where N is an integer between 1 and $2^n$.

The PLL of the present invention can be implemented utilizing the following integrated circuit chips:

n-bit ADDER 101: TI SN 74LS283
n-D-type latches 102: TI SN74174
Divide circuit 20: TI SN74LS718
Phase comparator 30: Motorola MC4044
Up/down counter 40: TI SN 74LS168

While there has been shown what is considered to be the preferred embodiment of the invention, it will be manifest that many changes and modifications can be made therein without departing from the essential spirit and scope of the invention. It is intended, therefore, in the annexed claims, to cover all such changes and modifications which fall within the true scope of the invention.

I claim:

1. A digital phase locked loop comprising:
   (a) a digital controlled oscillator means for generating an output signal having a frequency which is a function of a value associated with a digital input word, wherein said digital controlled oscillator means comprises:
      (i) storage means, for holding a binary sum word;
      (ii) adder means, operatively connected to said storage means and to said counter means, for generating a new binary sum word, the new binary sum word being the sum of the binary sum word received from said storage means and the binary number received from said counter means, the new binary sum word being stored in said storage means to generate another sum word during the subsequent add cycle; and
      (iii) output means, operatively connected to said adder means, for strobing a carry signal resulting from the generation of the new binary sum word by said adder means, to generate said output signal;
   (b) counter means, operatively connected to said digital controlled oscillator means, having an up input terminal adapted to receive an up input signal, and having a down input terminal adapted to receive a down input signal, for modifying a binary number contained in said counter means in response to said up input signal and in response to said down input signal, said binary number being operatively coupled to said digital controlled oscillator means; and
   (c) phase comparator means, operatively connected to said counter means, for comparing the frequency of a reference signal to the frequency of said output signal, to generate the up input signal when the output signal lags the reference signal, and to generate the down input signal when the output signal leads the reference signal.

2. A digital phase locked loop according to claim 1, further comprising:
   divide network means, interposed between said digital controlled oscillator means and said phase comparator means, for providing a scaling of said output signal.

* * * * *